(12) United States Patent
Lim et al.

(10) Patent No.: US 9,306,509 B2
(45) Date of Patent: *Apr. 5, 2016

(54) RECEIVER HAVING A WIDE COMMON MODE INPUT RANGE

(75) Inventors: Siok Wei Lim, Singapore (SG); Cheng-Hsiang Hsieh, San Jose, CA (US); Jafar Savoj, Sunnyvale, CA (US)

(73) Assignee: XILINX, INC., San Jose, CA (US)

(*) Notice: Subject to any disclaimer, the term of this patent is extended or adjusted under 35 U.S.C. 154(b) by 902 days.

This patent is subject to a terminal disclaimer.

(21) Appl. No.: 13/560,944

(22) Filed: Jul. 27, 2012

(65) Prior Publication Data

US 2014/0029143 A1 Jan. 30, 2014

(51) Int. Cl.
*H02H 9/00* (2006.01)
*H03F 1/52* (2006.01)
*H03F 3/45* (2006.01)
*H03F 3/72* (2006.01)
*H04L 27/00* (2006.01)
(Continued)

(52) U.S. Cl.
CPC ............ *H03F 1/523* (2013.01); *H03F 3/45224* (2013.01); *H03F 3/45233* (2013.01); *H03F 3/72* (2013.01); *H04L 27/0002* (2013.01); *H03F 2200/444* (2013.01); *H03F 2203/45091* (2013.01); *H03F 2203/45092* (2013.01); *H03F 2203/45466* (2013.01); *H03F 2203/45494* (2013.01); *H03F 2203/45568* (2013.01); *H03H 11/1213* (2013.01); *H04L 25/0276* (2013.01)

(58) Field of Classification Search
CPC .................................................. H01L 27/0266
USPC .......................................................... 361/56
See application file for complete search history.

(56) References Cited

U.S. PATENT DOCUMENTS 4,706,036 A * 11/1987 Rebeschini .................... 330/253
5,977,828 A    11/1999 Hu et al.
6,617,926 B2 *  9/2003 Casper et al. ................. 330/258

(Continued)

FOREIGN PATENT DOCUMENTS

CN         1436400      8/2003
CN       101427461      5/2009

OTHER PUBLICATIONS

Zhong, Freeman et al., "A 1.0625~14.025 Gb/s Multi-Media Transceiver With Full-Rate Source-Series-Terminated Transmit Driver and Floating-Tap Decision-Feedback Equalizer in 40nm CMOS", IEEE Journal of Solid-State Circuits, Dec. 2011, pp. 3126-3139, vol. 46, No. 12.

(Continued)

*Primary Examiner* — Stephen W Jackson
(74) *Attorney, Agent, or Firm* — LeRoy D. Maunu (57) ABSTRACT

In one embodiment, a differential amplifier is provided. Gates of a first differential pair of transistors, of a first conductivity type, and a second pair or transistors, of a second conductivity type are coupled to first and second input terminals of the differential amplifier. A first pair of adjustable current sources are configured to adjust respective tail currents of the first differential pair of transistors in response to a first bias current control signal. A second pair of adjustable current sources are configured to adjust respective tail currents of the second differential pair of transistors in response to the first bias current control signal. A third pair of adjustable current sources are configured to adjust respective currents through the second differential pair of transistors in response to a second bias current control signal.

20 Claims, 5 Drawing Sheets

(51) Int. Cl.
  *H03H 11/12* (2006.01)
  *H04L 25/02* (2006.01)

(56) References Cited

U.S. PATENT DOCUMENTS 6,642,788 B1 * 11/2003 Abughazaleh ................ 330/253
6,882,224 B1    4/2005 Gaboury et al.
7,023,275 B2 *  4/2006 Miyamoto .................... 330/254
8,222,967 B1    7/2012 Raman et al.
2011/0291758 A1 12/2011 Hsieh

OTHER PUBLICATIONS

Savoj, Jafar et al., "Design of High-Speed Wireline Transceivers for Backplane Communications in 28nm CMOS", IEEE Orange County Solid-State Circuits Society (SSCS), Sep. 15, 2012, pp. 1-4.

* cited by examiner

RECEIVER HAVING A WIDE COMMON MODE INPUT RANGE

FIELD OF THE INVENTION

An embodiment of the present invention generally relates to transistor amplification, and more particularly to differential amplifiers.

BACKGROUND

A differential amplifier is a circuit that accepts inputs and determines a difference between them. Typical differential amplifiers take two inputs and generate a signal representing a voltage difference between the two inputs. Many circuits use difference comparators, such as analog to digital converters (ADC) or transceiver circuits.

Differential amplifiers are commonly used in communications systems to communicate signals between different circuits. For noise-immunity reasons, most communication standards utilize differential signaling. In differential signaling, data is transmitted in the form of a differential voltage across two nodes.

An ideal differential amplifier amplifies only the voltage difference between two inputs. Voltages common to both inputs are ideally rejected. However, due to differing communication standards, the common mode voltage utilized by various transmitters can vary widely between different transmitters. For example, some standards specify a high common mode voltage ranging between 700 mV and 1300 mV. Some standards, on the other hand, specify a low common mode voltage ranging between 145 mV and 350 mV, for example. In order to accommodate these various differential transmission circuits, a flexible receiver design needs to be able to accept different common mode voltages between the ground (0 mV) and the termination voltage (about 1200 mV).

Some previous approaches implement on-chip AC coupling capacitors on input signal lines to provide capacitive isolation between input terminals and a receiver circuit. The capacitive isolation allows the input common mode voltage of a receiver to be set independent of common mode voltage to the input terminals. However, if DC coupling is needed in a communication standard/protocol such as QuickPath Interconnect (QPI), where the receiver is directly connected to the transmitter without the AC coupling capacitors, the input common mode voltage may not be independently adjusted. Prior to reaching an analog front-end of a receiver, signals from a transmitter travel through backplane/cable that is generally lossy and behaves like a low pass filter, where high frequency components are attenuated and low frequency signals are largely unaffected. The transmission also results in intersymbol interference (ISI), where a current symbol will have an effect on an adjacent symbol when a sequence of random symbols is being transmitted. As a result, vertical eye opening of signals processed by the receiver are reduced and bit-error rate of the system is degraded.

One or more embodiments of the present invention may address one or more of the above issues.

SUMMARY

In one embodiment, a differential amplifier is provided. A first differential pair of transistors of a first conductivity type have gates coupled to first and second input terminals of the differential amplifier. A second differential pair of transistors of a second conductivity type have gates coupled to the first and second input terminals. A first pair of adjustable current sources are coupled to the first differential pair of transistors and are configured to adjust respective tail currents of the first differential pair of transistors in response to a first bias current control signal. A second pair of adjustable current sources are coupled to the second differential pair of transistors and are configured to adjust respective tail currents of the second differential pair of transistors in response to the first bias current control signal. A third pair of adjustable current sources are coupled to the second differential pair of transistors and are configured to adjust respective currents through the second differential pair of transistors in response to a second bias current control signal.

In another embodiment, an analog front-end circuit is provided. The analog front-end circuit includes a first electrostatic discharge circuit having inputs for receiving a differential signal from a transmission medium. Termination resistors are coupled to differential outputs of the first electrostatic discharge circuit and are configured to match the impedance of the analog front end to the impedance of the transmission medium. An equalizer circuit that includes a differential amplifier circuit is coupled to receive the differential signal from differential outputs of the termination resistors. The differential amplifier circuit includes an NMOS differential pair having inputs connected to the differential outputs of the termination resistors. The NMOS differential pair is configured to receive and amplify the differential signal using a high common mode voltage. The NMOS differential pair is biased during operation by a first pair of adjustable current sources in response to a first bias current control signal.

The differential amplifier circuit also includes a PMOS differential pair having inputs connected to the differential outputs of the termination resistors. The PMOS differential pair is configured to receive and amplify the differential signal using a low common mode voltage. The PMOS differential pair is biased during operation by a second pair of adjustable current sources in response to the first bias current control signal and by a third pair of adjustable current sources according to a second bias current control signal. The differential amplifier circuit includes a control circuit configured to enable operation of the PMOS differential pair and to disable operation of the NMOS differential pair when operating in a low common mode. The control circuit is further configured to enable operation the NMOS differential pair and disable operation of the PMOS differential pair when operating in a high common mode.

In yet another embodiment, a method of amplifying a differential signal is provided. The differential signal is provided to inputs of a PMOS differential pair and to inputs of an NMOS differential pair. In response to a common mode control signal indicating a high common mode, the NMOS differential pair is enabled, by biasing the NMOS differential pair with a first pair of adjustable current sources according to a first bias current control signal, and the PMOS differential pair is disabled. In response to the common mode control signal indicating a low common mode, the PMOS differential pair is enabled, by biasing the PMOS differential pair with a second pair of adjustable current sources according to the first bias current control signal and biasing the PMOS differential pair with a third pair of adjustable current sources according to a second bias current control signal, and the NMOS differential pair is disabled.

It will be appreciated that various other embodiments are set forth in the Detailed Description and Claims, which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

Due to differing communication standards, the common mode voltage can vary widely between different transmitters. For example, some standards use a high common mode voltage, while others use a low common mode voltage. In order to accommodate these various differential transmission circuits, a flexible receiver design needs to be able to process signals having different common mode voltages.

One or more embodiments provide a differential amplifier that is configurable to operate over a wide common-mode input range. The differential amplifier is implemented with complementary PMOS and NMOS source degenerated differential pairs that are connected in parallel. Each of the differential pairs is configured to compare a differential input signal over a fraction of the common mode range. For instance, the PMOS differential pair may be configured to compare signals having a low common mode voltage and the NMOS differential pair may be configured to compare signals having a high common mode voltage. The output current paths of the two differential pairs are summed across a shared resistor load to provide differential comparison across a wide common mode input range.

Figure 1:
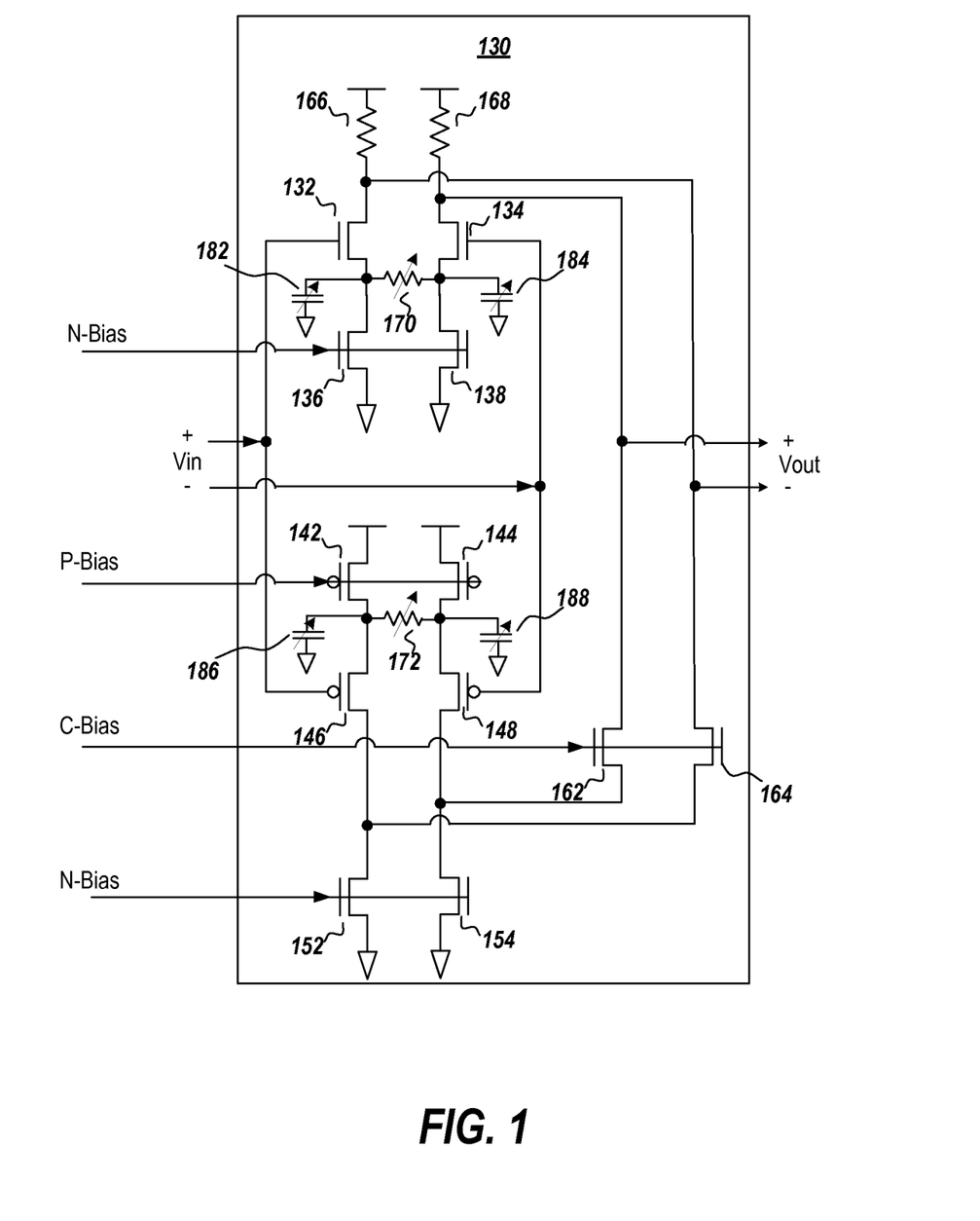
FIG. 1 shows a block diagram of a differential amplifier configured in accordance with one or more embodiments.

FIG. 1 shows a block diagram of a differential amplifier 130 configured in accordance with one or more embodiments. The differential amplifier includes an NMOS differential pair of transistors 132 and 134 for comparison of input differential signals having a high common mode voltage and includes a PMOS differential pair of transistors 146 and 148 for comparison of input differential signals having a low common mode voltage.

Transistors 132 and 134 of the NMOS differential pair are driven by respective differential inputs (Vin) and generate respective tail currents through bias transistors 136 and 138. The difference between the tail currents represents the voltage difference of the received differential inputs. A voltage difference (Vout) is generated from the difference in tail currents as the currents pass through resistors 166 and 168. The resistors 166 and 168 also act as current sources to the NMOS differential pair of transistors 132 and 134. Tail currents generated by transistors 132 and 134 of the NMOS differential pair are biased by a first pair of adjustable current sources, respectively implemented by NMOS transistors 136 and 138. The current is adjusted by adjusting gate voltages of the transistors.

Transistors 146 and 148 of the PMOS differential pair are driven by the respective differential inputs (Vin) and generate respective tail currents. Tails currents of transistors 146 and 148 of the PMOS differential pair are biased by a second pair of adjustable current sources, respectively implemented by NMOS bias transistors 152 and 154. Currents through the transistors 132 and 134 of the PMOS differential pair are also biased by a third pair of adjustable current sources, respectively implemented by PMOS transistors 142 and 144.

During operation, the PMOS and NMOS differential pairs are selectably enabled to provide differential comparison for a high common mode voltage or a low common mode voltage. The PMOS and NMOS differential pairs are enabled/disabled by three sets of bias current control signals (N-Bias, P-Bias, and C-Bias). As previously indicated, the NMOS differential pair 132 and 134 are used to compare differential signals having a high common mode voltage and the PMOS differential pair 146 and 148 are used to compare signals having a low common mode voltage.

When operated to receive high common mode signals, bias transistors 136 and 138 are biased against a bias current control signal (N-Bias) that is generated by a constant transconductance biasing circuit. As a result of the biasing, the input signals are centered within the saturation operating range of the NMOS transistors 132 and 134. The constant transconductance biasing provides a constant gain for the NMOS differential pair across all process-variation-temperature (PVT) corners of the transistors. The PMOS differential pair (146 and 148) is disabled by removing P-Bias and C-Bias voltages from gates of operating bias transistors 142, 144, 152, and 154, and cascade transistors 162 and 164. The P-Bias and C-Bias bias current control signals, are generated by mirroring the N-Bias bias current control signal. Removal of the P-Bias and C-Bias signals from gates of operating bias transistors causes the transistors to operate in an open state, which prevents current from passing through the PMOS differential pair (146 and 148). As indicated above, in this mode, a voltage difference (Vout) is generated as tail currents generated by transistors 132 and 134 of the NMOS differential pair pass through resistors 166 and 168.

When operated to amplify a signal having a low common mode voltage, the NMOS differential pair is disabled by removing N-Bias from gates of bias transistors 136 and 138. Removal of the N-Bias signal from gates of the transistors causes the transistors to operate in an open state, which prevents current from passing through the NMOS differential pair (132 and 134). Bias transistors 152 and 154 of the PMOS differential pair are biased with the N-bias signal. P-Bias is used to bias transistors 142 and 144 to center the input signals (Vin) within the saturation operating range of the PMOS differential pair 146 and 148. Because P-Bias is generated by mirroring the constant transconductance N-Bias signal, the PMOS differential pair will also exhibit constant transconductance behavior.

Cascade transistors 162 and 164 are provided to couple outputs of the PMOS differential pair to outputs of the differential amplifier (Vout) and steer tail currents of the PMOS differential pair, when biased by C-Bias signal, through the resistors 166 and 168 to generate a differential voltage (Vout). A baseline current flows through resistors 166 and 168, through cascade transistors 162 and 164 and through bias transistors 152 and 154, to a ground voltage. Due to the fixed bias current of bias transistors 152 and 154, the current passed through resistors 166 and 168 is inversely proportionally to the tail currents generated by the PMOS differential pair 146 and 148. In this manner, tail currents of the PMOS differential pair are converted to a voltage difference (Vout).

For each of the PMOS and NMOS differential pairs, gain is adjusted by respective degeneration resistors 170 and 172 connected between source terminals to the differential pair of transistors. The resistive load of the degeneration resistors 170 and 172 may be adjusted dynamically during operation, via a gain control signal (not shown), to control the high frequency gain of the differential pairs. The degeneration resistors may also be used to adjust the frequency zeroes of the differential pairs. In some embodiments, a zero frequency adjustment circuit may be included to provide further adjustment of frequency zeros in addition to that provided by the degeneration resistors 170 and 172. In one implementation, as shown in FIG. 1, the zero frequency adjustment circuit includes four programmable capacitors 182, 184, 186, and 188 coupled between a ground voltage and respective sources of the NMOS and PMOS differential pairs 132, 134, 146, and 148. Capacitance of the capacitors may be adjusted via respective capacitance control signals, for example, to adjust the zero frequency of the differential amplifier.

To avoid distortion or noise in the difference output, some embodiments may include a gain control circuit (not shown) configured to automatically adjust the gain based on feedback from a monitoring circuit to maintain a steady overall gain. This can be achieved, for example, by a digital feedback loop. Digital signals generate what are known as signal eyes, which are generated by the ensemble of all signal waveforms in a unit interval. The signal eyes can be used to determine the optimum gain to be used in the equalizer. Gain variation causes signal amplitude variation, which changes the vertical size of the post-equalization signal eye. Post-equalization of the output signal eye size is compared against a desired target signal eye. The comparison results then go through digital filtering to determine a necessary amount of gain adjustment. Control signals are then generated to adjust the gain of the differential pair that is being operated. A loop of this kind is typically called an automatic-gain-control (AGC) loop or a variable-gain-amplifier (VGA) loop. One skilled in the art will recognize that other AGC methods known in the art may be adapted for use in one or more embodiments of the present invention.

Figure 2:
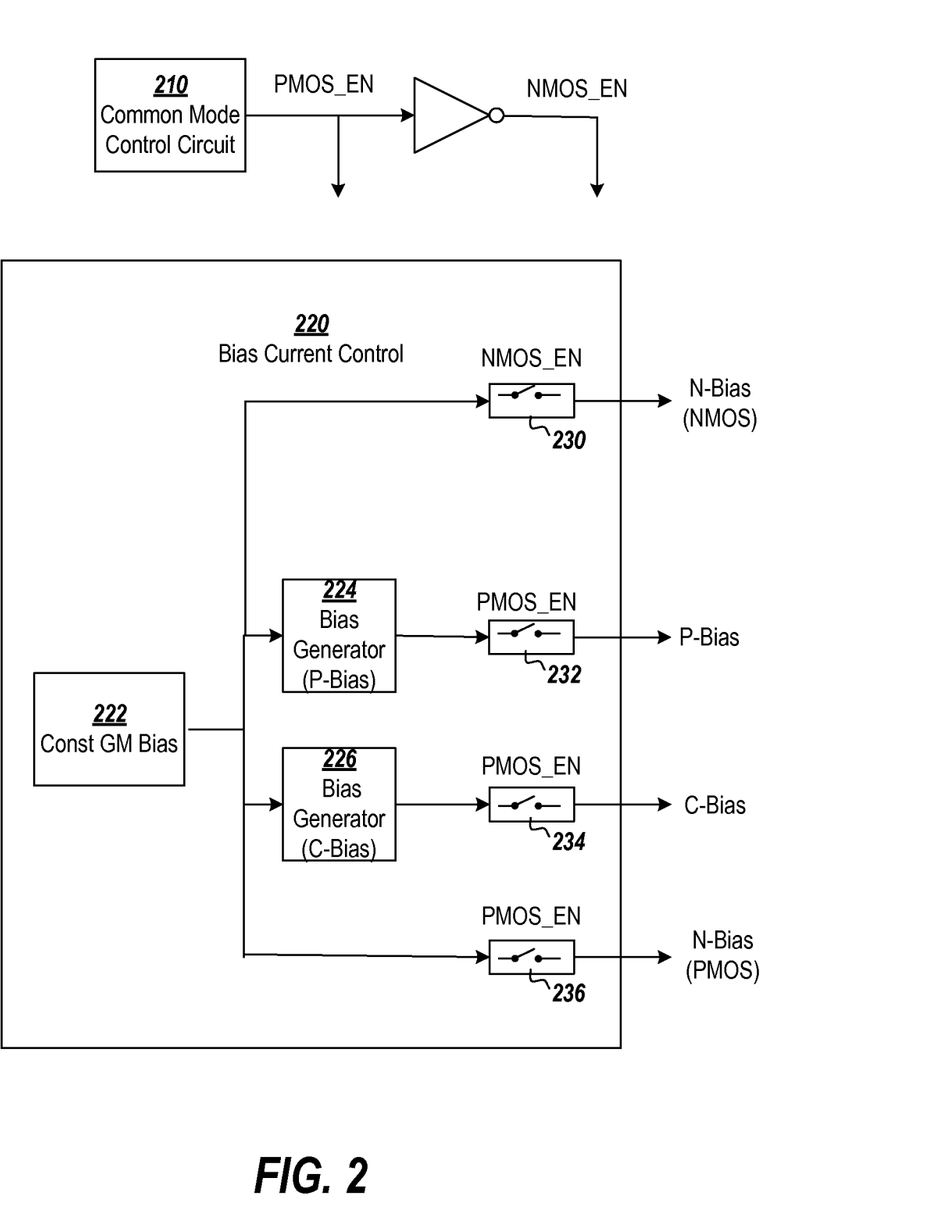
FIG. 2 shows a bias current control circuit and a common mode control circuit that may be used to generate bias current control signals and enable and disable the PMOS and NMOS differential pairs shown in FIG. 1.

FIG. 2 shows a bias current control circuit and a common mode control circuit that may be used to generate bias current control signals and enable and disable the PMOS and NMOS differential pairs shown in FIG. 1. Bias control circuit 220 includes a constant transconductance (GM) biasing circuit 222 configured to generate the N-Bias bias current control signal. A first bias generator 224 mirrors the N-Bias voltage to generate the P-Bias bias current control signal. A second bias generator 226 mirrors the N-Bias voltage to generate the C-Bias bias current control signal. The bias current control signals are selectively applied to or removed from the biasing and cascade transistors to enable or disable the NMOS and PMOS differential pairs as described. The bias current control signals are selectively applied to or removed from the biasing and cascade transistors by switches 230, 232, 234, and 236, which are controlled by PMOS_EN and NMOS_EN enable signals. The PMOS_EN and NMOS_EN enable signals are adjusted by common mode control circuit 210 to configure the differential amplifier shown in FIG. 1 for high or low common modes.

To operate the differential amplifier in a high common mode, the control circuit 210 sets NMOS_EN to close switch 230 and sets PMOS_EN to open switches 232, 234, and 236. As a result, bias transistors 136 and 138 of FIG. 1 are biased by the N-Bias signal to enable operation of the NMOS differential pair 132 and 134, and bias current control signals are removed from transistors 142, 144, 152, 154, 162, and 164 to disable the PMOS differential pair 146 and 148. Conversely, to operate the differential amplifier in a low common mode, the control circuit sets NMOS_EN to open switch 230 and sets PMOS_EN to close switches 232, 234, and 236. As a result, the N-Bias signal is removed from transistors 136 and 138 to disable the NMOS differential pair 132 and 134, and bias current control signals are delivered to transistors 142, 144, 152, 154, 162, and 164 to enable the PMOS differential pair 146 and 148.

Figure 3:
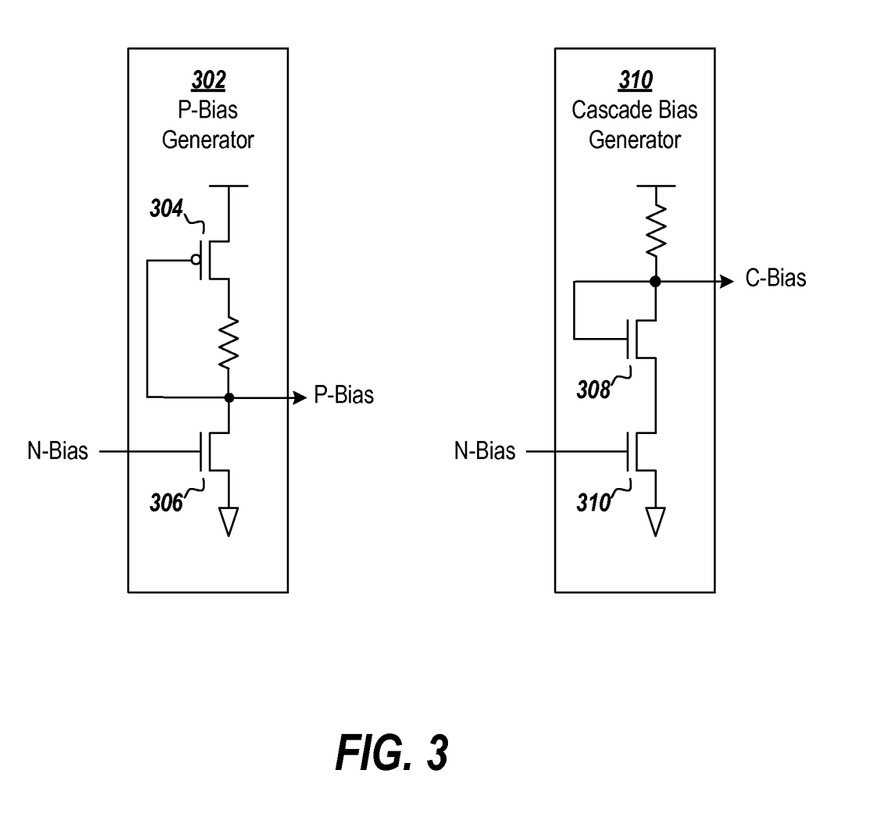
FIG. 3 shows current mirrors that may be used to generate P-Bias and C-Bias bias current control signals in accordance with one or more embodiments.

FIG. 3 shows current mirrors that may be used to generate P-Bias and C-Bias signals in accordance with one or more embodiments. P-Bias generator 302 is configured to generate the P-Bias signal by mirroring the N-Bias signal and may be used to implement the first generator 224 shown in FIG. 2. NMOS transistor 306 passes a current according to the N-Bias signal. PMOS transistor 304 is connected to a resistor to generate a gate voltage sufficient to match the current passed by NMOS transistor 306. The gate voltage of the PMOS transistor 304 is used as the P-Bias signal.

Cascade bias generator 310 is configured to generate the C-Bias signal by mirroring the N-Bias signal and may be used to implement the second bias generator 226 shown in FIG. 2. NMOS transistor 310 passes a current according to the N-Bias signal. NMOS transistor 308 is connected to a resistor to generate gate voltage sufficient to match the current passed by NMOS transistor 310. The gate voltage of the NMOS transistor 308 is used as the C-Bias signal.

Figure 4:
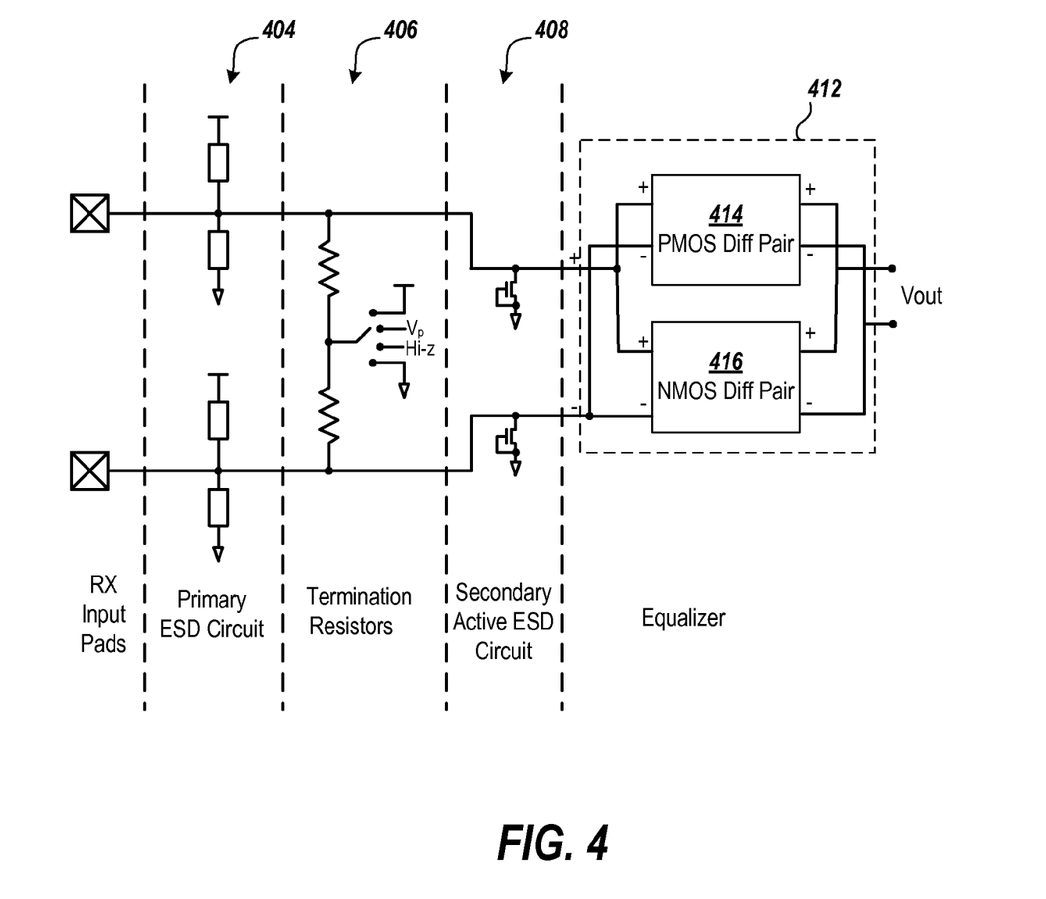
FIG. 4 shows a block diagram of an example analog front end circuit implemented in accordance with one or more embodiments.

FIG. 4 shows a block diagram of an example an analog front-end circuit implemented in accordance with several embodiments of the present invention. In this example, a differential signal is received and processed by a primary electrostatic discharge (ESD) circuit 404. The ESD circuit 404 prevents damage to the analog front end in case of sudden unwanted electric current on the transmission medium. In this example, the primary ESD circuit 404 is implemented using a pair of series connected diodes for each signal line. Each pair of series connected diodes is connected in series between a ground voltage and a termination voltage. The signal line is connected between the two diodes. If voltage on a signal line exceeds the termination voltage, a first one of the pair of diodes passes current from the signal line to a termination voltage supply line to reduce the voltage of the signal line. Conversely, if voltage on a signal line is less than the ground voltage, a second one of the pair of diodes passes current from a ground voltage line to the signal line to increase the voltage of the signal line.

Termination resistors 406 are included after the primary ESD circuit 404. The termination resistors 406 match the impedance of the analog front end to the impedance of the transmission medium and minimize signal reflection. In this example, impedance is matched using a passive termination resistor circuit. Different applications may require different types of termination resistance. In some applications, such as Ethernet, a resistor is provided between signal line and ground voltage. In some other applications, such as SCSI, a resistor is provided between the termination voltage and the signal line. In this example, the termination resistors 406 included a switch that may be programmed to connect the resistors to either the termination voltage, the ground, programmable common mode voltage ($V_p$), or not connect (Hi-Z), as required for a particular application.

A secondary active ESD circuit 408 is connected after the termination resistors to further protect the circuit from electrostatic pulses. An equalizer circuit 412, which is implemented with a differential amplifier circuit (differential pairs 414 and 416), receives and processes the signals from the secondary active ESD 408. The equalizer circuit 412 produces a difference of the received differential input independent of the input common mode voltage. As discussed above, the equalizer circuit 412 includes a pair of PMOS and NMOS differential pairs 414 and 416 implemented as discussed above. The PMOS differential pair 414 provides comparison of differential signals having a low common mode voltage and the NMOS differential pair 416 provides comparison of differential signals having a high common mode voltage.

In some embodiments, the equalizer circuit 412 may be implemented as a multistage continuous time linear equalizer (CTLE). For example, in one embodiment a multistage CTLE may be implemented using three differential amplifier stages, where the second and third stage only contains NMOS differential pair 416 as discussed above. The first stage is configured to provide input common mode adjustment and high frequency signal boost, the second stage is configured to provide long tail cancellation, and the third stage is configured to adjust gain of the signal.

Due to the configurability of common mode, one or more embodiments are thought to be particularly suited for programmable ICs, which may be used in different applications that utilize differing communication standards and input common mode voltages.

Figure 5:
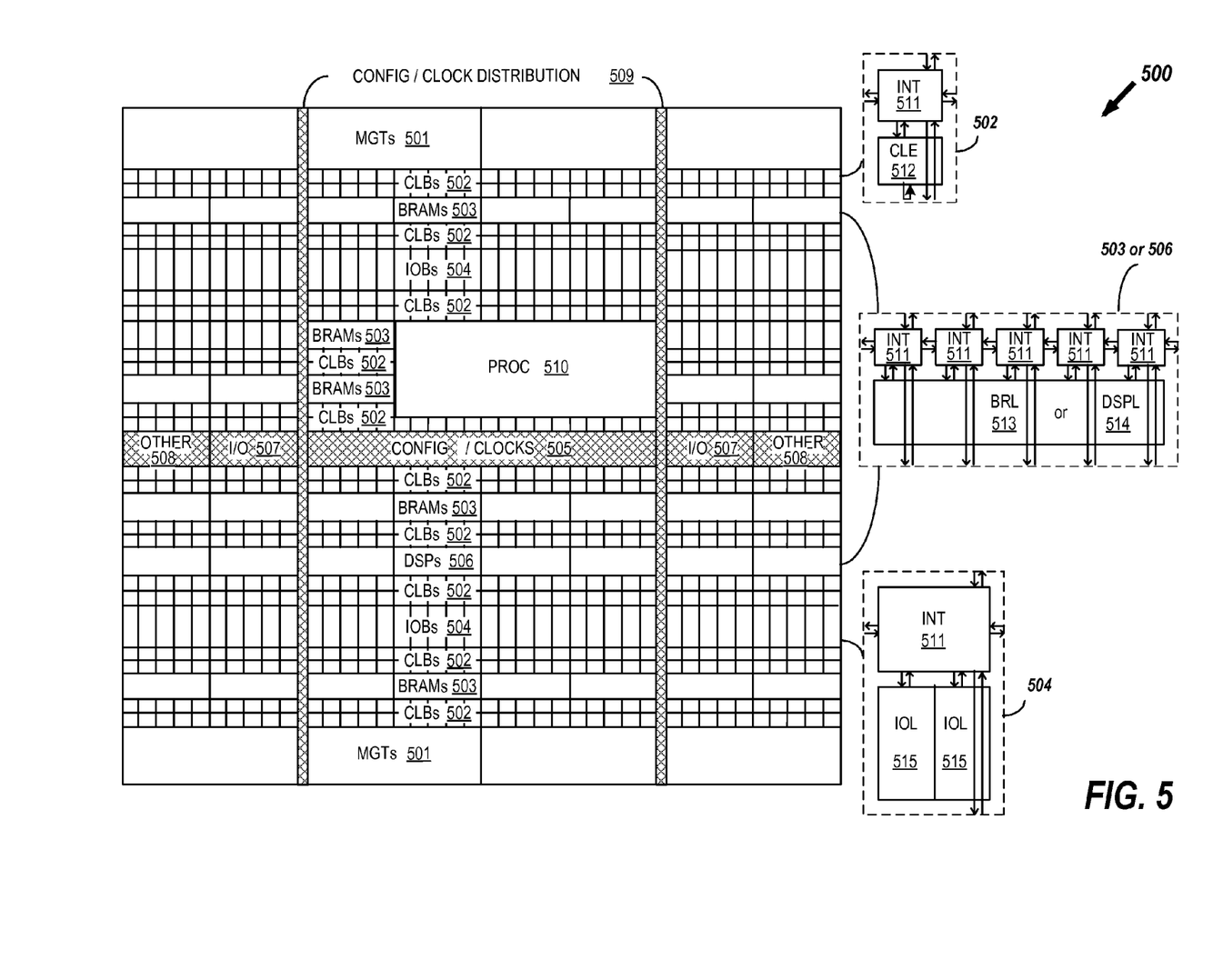
FIG. 5 is a block diagram of an example programmable integrated circuit that may be implemented to include transceiver circuits consistent with one or more embodiments.

FIG. 5 is a block diagram of an example programmable integrated circuit. A programmable IC may include a plurality of transceiver circuits for input and output communication. An analog front end of transceiver circuits may be implemented using a differential amplifier as discussed above to allow input common mode to be configured in a wide common mode range.

FPGAs can include several different types of programmable logic blocks in the array. For example, FIG. 5 illustrates an FPGA architecture (500) that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some FPGAs also include dedicated processor blocks (PROC) 510 and internal and external reconfiguration ports (not shown).

In some FPGAs, each programmable tile includes a programmable interconnect element (INT) 511 having standardized connections to and from a corresponding interconnect element in each adjacent tile. Therefore, the programmable interconnect elements taken together form the programmable interconnect structure for the illustrated FPGA. The programmable interconnect element INT 511 also includes the connections to and from the configurable logic element (CLE) within the same tile, as shown by the examples included at the top of FIG. 5.

For example, a CLB 502 can include a configurable logic element CLE 512 that can be programmed to implement user logic, plus a single programmable interconnect element INT 511. A BRAM 503 can include a BRAM logic element (BRL) 513 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL) 514 in addition to an appropriate number of programmable interconnect elements. An IOB 504 can include, for example, two instances of an input/output logic element (IOL) 515 in addition to one instance of the programmable interconnect element INT 511. As will be clear to those of skill in the art, the actual I/O bond pads connected, for example, to the I/O logic element 515, are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA, more than one adjacent column of CLBs is typically included wherever the CLBs appear, to facilitate the efficient implementation of user logic.

One or more embodiments are described in terms of an FPGA. Those skilled in the art will appreciate, however, that the invention could be implemented in different FPGA architectures, other types of programmable logic devices (PLDs) other than FPGAs, integrated circuits that include programmable logic circuitry and/or adapted to various application requirements, based on both volatile and non-volatile technologies.

One or more embodiments are thought to be applicable to a variety of applications utilizing differential amplifier circuits. Other aspects and embodiments will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A differential amplifier, comprising:
   first and second input terminals;
   a first differential pair of transistors having a first conductivity type and gates coupled to the first and second input terminals, respectively;
   a second differential pair of transistors having a second conductivity type and gates coupled to the first and second input terminals, respectively;
   a first pair of adjustable current sources coupled to the first differential pair of transistors and configured to adjust respective tail currents of the first differential pair of transistors in response to a first bias current control signal;
   a second pair of adjustable current sources coupled to the second differential pair of transistors and configured to adjust respective tail currents of the second differential pair of transistors in response to the first bias current control signal; and
   a third pair of adjustable current sources coupled to the second differential pair of transistors and configured to adjust respective currents through the second differential pair of transistors in response to a second bias current control signal.

2. The differential amplifier of claim 1, further comprising a constant transconductance bias generator coupled to the first and second pairs of adjustable current sources and configured to generate the first bias current control signal.

3. The differential amplifier of claim 1, further comprising, a bias generation circuit coupled to the third pair of adjustable current sources and configured to generate the second bias current control signal from the first bias current control signal.

4. The differential amplifier of claim 1, wherein:
a first transistor of the first differential pair of transistors has a drain and a source, the drain coupled to receive a current from a first current source and coupled to a first output terminal of the differential amplifier, and the source coupled to a first one of the first pair of adjustable current sources;
a second transistor of the first differential pair of transistors has a drain and a source, the drain coupled to receive current from a second current source and coupled to a second output terminal of the differential amplifier, and the source coupled to a second one of the first pair of adjustable current sources;
a first transistor of the second differential pair of transistors has a source coupled to a first one of the third pair of adjustable current sources and has a drain coupled to a first one of the second pair of adjustable current sources; and
a second transistor of the second differential pair of transistors has a source coupled to a second one of the third pair of adjustable current sources and has a drain coupled to a second one of the second pair of adjustable current sources.

5. The differential amplifier of claim 4, further comprising:
a first MOSFET coupled between the drain of the first transistor of the second differential pair of transistors and the first output terminal of the differential amplifier, the first MOSFET having a gate coupled to receive a third bias current control signal; and
a second MOSFET coupled between the drain of the second transistor of the second differential pair of transistors and the second output terminal of the differential amplifier, the second MOSFET having a gate coupled to receive a third bias current control signal.

6. The differential amplifier of claim 4, further comprising a control circuit configured to:
while operating in a first mode, enable operation of the first differential pair of transistors and disable operation of the second differential pair of transistors; and
while operating in a second mode, enable operation of the second differential pair of transistors and disable operation of the first differential pair of transistors.

7. The differential amplifier of claim 6, wherein the control circuit is configured to:
perform the disabling of operation of the first differential pair of transistors by disconnecting the first bias current control signal from the first pair of adjustable current sources; and
perform the disabling of operation of the second differential pair of transistors by disconnecting the first bias current control signal from the third pair of adjustable current sources, disconnecting the second bias current control signal from the second pair of adjustable current sources, and disconnecting the third bias current control signal from the gates of the first and second MOSFETs.

8. The differential amplifier of claim 4, further comprising:
a first programmable resistor coupled between the sources of the first differential pair of transistors; and
a second programmable resistor coupled between the sources of the second differential pair of transistors, the first and second programmable resistors configured to adjust gain and frequency response of the differential amplifier in response to a gain control signal.

9. The differential amplifier of claim 4, further comprising:
a zero frequency adjustment circuit coupled to the first and second differential pairs of transistors, the zero frequency adjustment circuit configured to adjust a zero frequency of the differential amplifier in response to a frequency control signal.

10. The differential amplifier of claim 9, wherein the zero frequency adjustment circuit includes first, second, third, and fourth, programmable capacitors coupled between respective sources of the first and second differential pairs of transistors and a ground voltage.

11. The differential amplifier of claim 1, further comprising a termination resistor circuit coupled between the first and second input terminals.

12. The differential amplifier of claim 1, further comprising an electrostatic discharge circuit coupled to the first and second input terminals.

13. An analog front-end circuit, comprising:
a first electrostatic discharge circuit having inputs for receiving a differential signal from a transmission medium;
termination resistors coupled to differential outputs of the first electrostatic discharge circuit and configured to match the impedance of the analog front end to impedance of the transmission medium;
an equalizer circuit including a first differential amplifier circuit coupled to receive the differential signal from differential outputs of the termination resistors, the first differential amplifier circuit including:
an NMOS differential pair having inputs connected to the differential outputs of the termination resistors, the NMOS differential pair and configured to receive and amplify the differential signal using a high common mode voltage, the NMOS differential pair biased during operation by a first pair of adjustable current sources in response to a first bias current control signal;
a PMOS differential pair having inputs connected to the differential outputs of the termination resistors, the PMOS differential pair configured to receive and amplify the differential signal using a low common mode voltage, the PMOS differential pair biased during operation by a second pair of adjustable current sources in response to the first bias current control signal and by a third pair of adjustable current sources in response to a second bias current control signal; and
a control circuit configured to:
when operating in a low common mode, enable operation of the PMOS differential pair and disable operation of the NMOS differential pair; and
when operating in a high common mode, enable operation of the NMOS differential pair and disable operation of the PMOS differential pair.

14. The analog front-end circuit of claim 13, wherein the equalizer circuit further includes:
a second differential amplifier circuit coupled to receive the differential signal from differential outputs of the first differential amplifier circuit; and
a third differential amplifier circuit coupled to receive the differential signal from differential outputs of the second differential amplifier circuit.

15. The analog front-end circuit of claim 14, wherein:
the first differential amplifier circuit is configured to perform high frequency boost of the differential signal;

the second differential amplifier circuit is configured to perform long-tail cancellation of the differential signal; and the third differential amplifier circuit is configured to boost gain of the differential signal.

16. The analog front-end circuit of claim 14, further comprising:
a constant transconductance bias generator connected to the first and second pairs of adjustable current sources, the transconductance bias generator configured to generate the first bias current control signal.

17. The analog front-end circuit of claim 14, further comprising a biasing circuit connected to the third pair of adjustable current sources and configured to generate the second bias current control signal from the first bias voltage.

18. A method of amplifying a differential signal, comprising:
providing the differential signal to inputs of a PMOS differential pair;
providing the differential signal to inputs of an NMOS differential pair;
in response to a common mode control signal indicating a high common mode:
enabling the NMOS differential pair by biasing the NMOS differential pair with a first pair of adjustable current sources in response to a first bias current control signal; and
disabling the PMOS differential pair; and
in response to the common mode control signal indicating a low common mode:
enabling the PMOS differential pair by biasing the PMOS differential pair with a second pair of adjustable current sources in response to the first bias current control signal and biasing the PMOS differential pair with a third pair of adjustable current sources in response to a second bias current control signal; and
disabling the NMOS differential pair.

19. The method of claim 18, wherein:
disabling the NMOS differential pair includes removing the first bias current control signal from the first pair adjustable current sources; and
disabling the PMOS differential pair includes:
removing the first bias current control signal from the second pair of adjustable current sources; and
removing the second bias current control signal from the third pair of adjustable current sources.

20. The method of claim 19, further comprising:
in response to the common mode control signal indicating the low common mode, respectively coupling first and second outputs of the PMOS differential amplifier to first and second outputs of the NMOS differential amplifier with a pair of transistors by applying a third bias current control signal to the pair of transistors; and
in response to the common mode control signal indicating the low common mode, disconnecting the first and second outputs of the PMOS differential amplifier from the first and second outputs of the NMOS differential amplifier with a pair of transistors by removing the third bias current control signal from the pair of transistors.

* * * * *